(12) United States Patent
Pottier et al.

(10) Patent No.: US 12,149,110 B2
(45) Date of Patent: Nov. 19, 2024

(54) BATTERY CELL MONITORING SYSTEMS, BATTERY PACKS, AND METHODS OF OPERATION OF THE SAME

(71) Applicant: Arm Limited, Cambridge (GB)

(72) Inventors: Remy Pottier, Grenoble (FR); Emre Özer, Buckden (GB); John Philip Biggs, Cambridge (GB); James Edward Myers, Great Wilbraham (GB); Jedrzej Kufel, Cambridge (GB)

(73) Assignee: Arm Limited, Cambridge (GB)

( * ) Notice: Subject to any disclaimer, the term of this patent is extended or adjusted under 35 U.S.C. 154(b) by 498 days.

(21) Appl. No.: 17/501,836

(22) Filed: Oct. 14, 2021

(65) Prior Publication Data
US 2023/0117908 A1 Apr. 20, 2023

(51) Int. Cl.
*H02J 7/00* (2006.01)
*G01R 31/382* (2019.01)
*G06N 20/00* (2019.01)
*H01M 10/48* (2006.01)

(52) U.S. Cl.
CPC .......... *H02J 7/0047* (2013.01); *G01R 31/382* (2019.01); *G06N 20/00* (2019.01); *H01M 10/482* (2013.01)

(58) Field of Classification Search
CPC ........ H02J 7/0047; H02J 7/0048; H02J 7/005; G01R 31/382; G06N 20/00; H01M 10/482; H01M 10/488; H01M 2010/4278; H01M 2220/20; H01M 10/48; H01M 2010/4271; H01M 10/425; H01M 10/486; Y02E 60/10

USPC ......................................................... 320/132
See application file for complete search history.

(56) References Cited

U.S. PATENT DOCUMENTS

| | | | | |
|---|---|---|---|---|
| 8,274,261 | B2* | 9/2012 | Seman, Jr. .......... | H01M 10/441 324/426 |
| 10,243,385 | B2* | 3/2019 | MirTabatabaei ........ | H02J 7/007 |
| 10,734,690 | B2* | 8/2020 | Katrak ............... | G01R 31/3835 |
| 10,923,776 | B2* | 2/2021 | Spare ..................... | H01M 10/48 |
| 11,283,280 | B2* | 3/2022 | Kim .................. | H02J 7/007182 |
| 11,283,283 | B2* | 3/2022 | Daniels ................. | H01M 10/48 |
| 11,505,088 | B2* | 11/2022 | Choi .................... | H01M 50/249 |
| 11,874,240 | B2* | 1/2024 | Drake .................... | G06N 20/00 |

(Continued)

FOREIGN PATENT DOCUMENTS

| | | | | |
|---|---|---|---|---|
| CN | 104425850 B | * | 1/2019 | ............... G06F 1/26 |
| CN | 209592233 U | * | 11/2019 | ............. Y02E 60/10 |

(Continued)

*Primary Examiner* — M Baye Diao
(74) *Attorney, Agent, or Firm* — NIXON & VANDERHYE P.C.

(57) ABSTRACT

Battery cell monitoring systems comprising a flexible substrate and components integrated onto the flexible substrate, and methods of operating the same are disclosed. The components comprise a computing device and at least one sensor, where the at least one sensor is configured to generate sensor signals indicative of a physical state of the battery cell. The computing device is configured to hold characteristic data values which have been generated based on prior sensor signals. The computing device is configured to receive the sensor signals from the at least one sensor and to generate battery cell status data in dependence on the sensor signals and the characteristic data values.

18 Claims, 7 Drawing Sheets

(56) References Cited

U.S. PATENT DOCUMENTS

| | | | | |
|---|---|---|---|---|
| 2004/0107011 A1* | 6/2004 | Moselli | ................ | G05B 13/027 |
| | | | | 429/432 |
| 2010/0068607 A1* | 3/2010 | Spare | .................... | H01M 10/48 |
| | | | | 429/163 |
| 2013/0038293 A1* | 2/2013 | Seman, Jr. | .......... | H01M 10/441 |
| | | | | 320/134 |
| 2015/0278262 A1* | 10/2015 | Yoshida | .................. | G06F 16/22 |
| | | | | 707/755 |
| 2017/0222447 A1* | 8/2017 | Ravi | ..................... | H01M 10/48 |
| 2018/0145521 A1* | 5/2018 | Hwang | ............... | H02J 7/00047 |
| 2018/0373233 A1* | 12/2018 | Goto | ................ | G05B 19/4065 |
| 2019/0033386 A1* | 1/2019 | Katrak | ................ | H01M 10/425 |
| 2020/0020992 A1* | 1/2020 | Hofer | .................. | H01M 10/486 |
| 2021/0057920 A1* | 2/2021 | Husain | ...................... | H02J 7/24 |
| 2021/0155117 A1* | 5/2021 | Choi | .................... | H01M 50/249 |
| 2022/0037902 A1* | 2/2022 | Forssell | .................. | B60L 50/60 |
| 2022/0276317 A1* | 9/2022 | Sudarsan | ............. | G01R 31/392 |
| 2023/0369660 A1* | 11/2023 | Lee | .................... | H01M 50/249 |

FOREIGN PATENT DOCUMENTS

| | | | | | |
|---|---|---|---|---|---|
| FR | | 3057674 A1 | * | 4/2018 | ......... G01R 31/3648 |
| JP | | 2022069275 A | * | 5/2022 | ............. G06N 20/00 |
| KR | | 102575963 B1 | * | 9/2023 | ........... G01R 31/382 |
| WO | WO-2013048925 A2 | | * | 4/2013 | ............ G06F 1/1626 |
| WO | WO-2021089786 A1 | | * | 5/2021 | ........... G01R 31/367 |

* cited by examiner

BATTERY CELL MONITORING SYSTEMS, BATTERY PACKS, AND METHODS OF OPERATION OF THE SAME

TECHNICAL FIELD

The present disclosure relates to electric batteries.

DESCRIPTION

An electric battery, for example a rechargeable electric battery, may be used as an energy storage medium in a wide range of applications, such as in the case of an electric vehicle battery (EVB), where the electric vehicle may take a wide variety of forms, such as cars, scooters, bikes, as well as other industrial or consumer devices. An electric battery usually consists of several battery cells organised into a battery module, and several battery modules organised into a battery pack. The battery pack may be provided with electronic circuitry supporting a battery management system. Such battery packs may be vulnerable to disruptive or even dangerous events such as thermal runaway (a rapid temperature rise) in one or more of its cells for example due to a short circuit occurring due to physical shock or overcharging.

SUMMARY

In one example described herein there is a battery cell monitoring system comprising:
a flexible substrate; and
components integrated onto the flexible substrate, wherein the components comprise:
  a computing device; and
  at least one sensor,
wherein the at least one sensor is configured to generate sensor signals indicative of a physical state of the battery cell,
wherein the computing device is configured to hold characteristic data values and the characteristic data values have been generated based on prior sensor signals,
and the computing device is configured to receive the sensor signals from the at least one sensor and to generate battery cell status data in dependence on the sensor signals and the characteristic data values.

In one example described herein there is a battery pack comprising:
a plurality of battery modules, wherein each battery module comprises a plurality of battery cells and wherein at least one of the plurality of battery cells comprises the battery cell monitoring system as claimed in claim 12; and
a battery pack management system comprising reception circuitry configured to receive the transmission from the transmission circuitry of the battery cell monitoring system.

In one example described herein there is a method of operating a battery cell monitoring system comprising a flexible substrate, wherein the method comprises:
generating sensor signals in at least one sensor integrated on the flexible substrate indicative of a physical state of the battery cell;
holding characteristic data values in a computing device integrated on the flexible substrate, wherein the characteristic data values have been generated based on prior sensor signals;
receiving the sensor signals at the computing device integrated on the flexible substrate from the at least one sensor integrated on the substrate; and
generating battery cell status data in dependence on the sensor signals and the characteristic data values.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Before discussing the embodiments with reference to the accompanying figures, the following description of embodiments is provided.

In accordance with one example configuration disclosed there is provided a battery cell monitoring system comprising:
a flexible substrate; and
components integrated onto the flexible substrate, wherein the components comprise:
  a computing device; and
  at least one sensor,
wherein the at least one sensor is configured to generate sensor signals indicative of a physical state of the battery cell,
wherein the computing device is configured to hold characteristic data values and the characteristic data values have been generated based on prior sensor signals,
and the computing device is configured to receive the sensor signals from the at least one sensor and to generate battery cell status data in dependence on the sensor signals and the characteristic data values.

Where previous approaches to battery management have focused on the battery pack or battery module level, the present disclosure proposes the provision of monitoring capability at the battery cell level. This is at least in part based on the recent development of data processing apparatuses fabricated on the basis of a flexible substrate, where the components of a data processing apparatus are integrated onto the flexible substrate. The ability to manufacture such a flexible data processing apparatus, which may in particular (although not only) be created by printing the components onto the flexible substrate, is made use of here, in that it has been realised by the inventors of the present techniques that "intelligent" monitoring of an electric battery can advantageously be implemented at the battery cell level in a cost effective manner. The techniques proposed herein, whereby one or more sensors coupled to a computing device are integrated onto the flexible substrate enable valuable battery cell status information to be derived from the sensor signal (s) generated by the one or more sensors and to be compared by the computing device against characteristic data values based on prior sensor signals, such that the computing device can configure the battery cell status data it generates to provide useful information down to the individual battery cell level of an electric battery, and on the basis of which various electric battery management actions may be taken, potentially at the individual battery cell level, but also at the battery module level, or even at the entire battery pack level, to ensure the ongoing health the operation of the electric battery, and ideally to avoid undesirable events such as the above-mentioned thermal runaway from occurring, or alternatively to take damage limiting and/or safety enhancing actions in response. Although not limited to these use-cases, the disclosed battery cell monitoring system may for example be employed for the purposes of (early) thermal runaway detection, for charging/discharging monitoring and optimisation, and for battery cell lifecycle health status management for future recycling or re-use of the battery cell.

The computing device may be variously configured, but in some examples disclosed herein the computing device comprises machine learning capability configured to infer correspondences between patterns of sensor signals and classifications of battery cell physical states, wherein the characteristic data values have at least partially been generated based on the prior sensor signals in a training phase in which the machine learning capability learned the correspondences, and wherein the battery cell status data is generated in dependence on an inferred classification in dependence on the sensor signals. This ability of the computing device may be variously provided and may in various contexts be referred to as machine learning, artificial intelligence, smart processing, and so on, and may be based on various techniques and algorithms, such as neural networks, support vector machines, and so on. Generally, according to the proposed techniques the training phase is provided in order for the computing device to form associations between sensor signals (and sensor signal combinations) and pre-defined classifications of battery cell physical states.

It should be noted that the techniques disclosed herein firstly proposes that the training phase may be carried out in association with the very same battery cell monitoring system which then later makes use of the learned classifications in order to infer classifications in dependence on "live" sensor signals when the battery cell is in real operation. Nevertheless, the techniques proposed herein secondly propose as an alternative that the training phase may be carried out in association with a different battery cell monitoring system than the battery cell monitoring system which later makes use of the learned classifications. Accordingly, in some examples disclosed herein the characteristic data values have at least partially been generated by another battery cell monitoring system operating in a training phase, wherein the other computing device comprises machine learning capability configured to learn correspondences between patterns of sensor signals and classifications of battery cell physical states, wherein in the training phase the machine learning capability of the other battery cell monitoring system learned the correspondences and the characteristic data values generated by the other battery cell monitoring system have been transferred to the battery cell monitoring system, and wherein the battery cell status data is generated in dependence on an inferred classification in dependence on the sensor signals. This approach may have various advantages, for example that the correspondences learned by one battery cell monitoring system in a training phase may then be transferred to multiple other battery cell monitoring systems, where the multiplicity of those battery cell monitoring systems is in principle unlimited. Equally this approach also means that the battery cell monitoring system in the training phase, or indeed multiple different battery cell monitoring systems used in training phases, may be tested to destruction in order for useful predictive data to be derived as to sensor signals and/or sensor signal combinations which may precede such destructive events, in order that a battery cell monitoring system in later, live use may identify the very first signs of such events, before they have caused any damage and the battery cell can still be maintained in good working order by virtue of some aspects of its operation being modified.

In some examples disclosed herein the battery cell physical states in the training phase comprise healthy battery cell statuses and/or non-healthy battery cell statuses. Thus the computing device can be configured to identify some signals (or signal combinations) as healthy battery cell statuses (and for example then to treat other unknown signals as unhealthy), and/or can be configured to identify some signals (or signal combinations) as non-healthy battery cell statuses (and for example then to treat other unknown signals as healthy).

The training phase may provide various battery cell physical states in a variety of ways in order for the training phase to be conducted, but in some examples disclosed herein the battery cell physical states in the training phase comprise a range of battery cell physical states in a progression from a healthy battery cell status to a non-healthy battery cell status. On this basis the computing device can then be trained to identify at an early stage deviations from healthy battery cell status which are suggestive of progress towards a non-healthy battery cell status.

The at least one sensor may take any form which, depending on the limitation, is deemed of use in the context of battery cell monitoring, but in some examples disclosed herein the at least one sensor comprises one or more of: a temperature sensor; a gas emission sensor; a physical deformation sensor; a humidity sensor, a voltage sensor; and a current sensor.

The battery cell status data may be responded to in a variety of ways, and accordingly the battery cell monitoring system may be provided with a variety of further circuitry in order to support such responses, but in some examples disclosed herein the components further comprise battery cell operation control circuitry, wherein the battery cell operation control circuitry is configured to control an operation of the battery cell in dependence on the battery cell status data.

The operation of the battery cell which is controlled by the battery cell operation control circuitry independence on the battery cell status data may take a great variety of forms, but in some examples disclosed herein the operation of the battery cell comprises charging of the battery cell. For example, it has been recognised that one context in which an increase in temperature of the battery cell can occur, and therefore where the potential for thermal runaway is greater, is when the battery cell is being charged. Accordingly, the charging of the battery cell may be controlled by the battery cell preparation control circuitry, for example by reducing the rate of charging in response to an increase in temperature of the battery cell, in response to the temperature of the battery cell crossing a temperature threshold, or in response to any other sensor signals (or combinations of sensor signals) such as may be provided by the above-mentioned temperature sensor, gas emission sensor, physical deformation sensor, voltage sensor, current sensor, or any other variety of sensor with which the battery cell monitoring system is provided. In other examples disclosed herein the operation of the battery cell comprises usage discharging of the battery cell, i.e. when the electrical device for which the battery cell provides (part of) the power is drawing current.

Whilst in some examples the battery cell monitoring system may be arranged such that the battery cell status data is monitored and responded to on an instantaneous basis, i.e. a given response at a given moment is dependent only on the battery cell status data at that given moment, in some examples disclosed herein the components further comprise a status data storage configured to store iterations of battery cell status data generated by the computing device. The provision of the status data storage enables the battery cell status to be recorded over a period of time.

The battery cell status data stored in the status data storage may be made use of in a variety of ways. In some examples disclosed herein the computing device further comprises battery cell history processing circuitry, wherein the battery cell history processing circuitry is configured to determine a battery cell status in dependence on the iterations of battery cell status data stored in the status data storage. This can allow for an overall status to be determined, which in certain circumstances may be useful, which takes a time progression of the iterations of battery cell status data to be taken into account, such as to determine a changing status of the battery cell.

Moreover, the storage of the battery cell status data in the status data storage, as a form of battery cell health log can be used for future recycling and/or re-use of the battery cell in other applications, i.e. the health log can indicate whether the battery cell is suitable for reuse or whether it would be preferable to recycle the materials of the battery cell. These techniques can be facilitated by the further use of a battery cell identification technology, which could be for example a printed RFID tag.

The battery cell monitoring system may be arranged to operate in a relatively autonomous manner, for example with modifications to the operation of the battery cell being made on the basis of the battery cell status data under the control of the computing device alone. Alternatively, or in addition, in some examples disclosed herein the components further comprise a status display, wherein status display is configured to modify its visual appearance in dependence on the battery cell status data generated by the computing device. Such a status display can allow a human to quickly and intuitively identify one or more battery cell statuses, such as whether the battery cell may generally be categorised as "in good working order" or whether it is currently in a status which is indicative of the need for it to be exchanged or repaired.

Further, whilst the battery cell monitoring system may be arranged to operate autonomously, in some examples disclosed the components further comprise transmission circuitry configured to send a transmission in dependence on the battery cell status data. The transmission may be conveyed in a variety of ways for example wired or wireless and may have a variety of targets, which may make use of the information transmitted in a variety of ways. In essence however this arrangement enables the battery cell status to be monitored by a further device or further devices, and which device or devices may receive such battery cell status information from more than one battery cell, such as is the case when battery cells are combined to form a battery module, and indeed when battery modules are combined to form a battery pack.

In accordance with one example configuration disclosed there is provided a battery pack comprising:
  a plurality of battery modules, wherein each battery module comprises a plurality of battery cells and wherein at least one of the plurality of battery cells comprises the battery cell monitoring system comprising the transmission circuitry described above; and
  a battery pack management system comprising reception circuitry configured to receive the transmission from the transmission circuitry of the battery cell monitoring system.

Accordingly, the battery pack management system can gather battery cell status information for at least a subset of the plurality of battery cells which make up one of the battery modules, which together form the battery pack.

The battery pack management system may make use of a transmission from a battery cell monitoring system in variety of ways, for example to record history of statuses of one or more battery cells under its overall control, but in some examples disclosed herein the battery pack management system comprises data processing circuitry, wherein the data processing circuitry is configured to control an operation of the battery pack in dependence on the transmission.

The operation of the battery pack may be controlled in variety of ways but in some examples disclosed herein the operation of the battery pack comprises charging of the battery pack. In some examples disclosed herein the operation of the battery pack comprises usage discharging of the battery pack.

The battery pack management system may control one or more battery cells, or one or more battery modules, in a variety of ways but in some examples disclosed herein the control of the operation of the battery pack comprises disabling at least one of: at least one of the plurality of battery modules; and at least one of the plurality of battery cells of at least one of the battery modules.

In some examples disclosed herein the control of the operation of the battery pack comprises modifying a charging rate or extent of at least one of: the plurality of battery modules; and the plurality of battery cells of at least one of the battery modules. Accordingly, the battery pack management system may for example slow down the rate of charging of one or more battery modules or battery cells, or may limit the extent to which one or more battery modules or battery cells is charged, in order to preserve better (and safer) overall operation of the battery pack.

In some examples disclosed herein the battery pack management system comprises data storage circuitry, and the data processing circuitry is configured to store at least one of: battery cell status data; and battery module status data, in dependence on transmissions received from battery cell monitoring systems. The storage of battery cell status data and/or battery module status data may be used to support a variety of techniques, such as the time progression of the status of one or more battery cells or one or more battery modules, and/or to record the history of operation of one or more battery cells or one or more battery modules. The battery pack management system may for example monitor a charge/discharge history of individual battery cells or modules, such that their suitability for further use, or the need to replace or repair them can be determined.

In accordance with one example configuration disclosed there is provided a method of operating a battery cell monitoring system comprising a flexible substrate, wherein the method comprises:

generating sensor signals in at least one sensor integrated on the flexible substrate indicative of a physical state of the battery cell;

holding characteristic data values in a computing device integrated on the flexible substrate, wherein the characteristic data values have been generated based on prior sensor signals;

receiving the sensor signals at the computing device integrated on the flexible substrate from the at least one sensor integrated on the substrate; and generating battery cell status data in dependence on the sensor signals and the characteristic data values.

Particular embodiments will now be described with reference to the figures.

Figure 1:
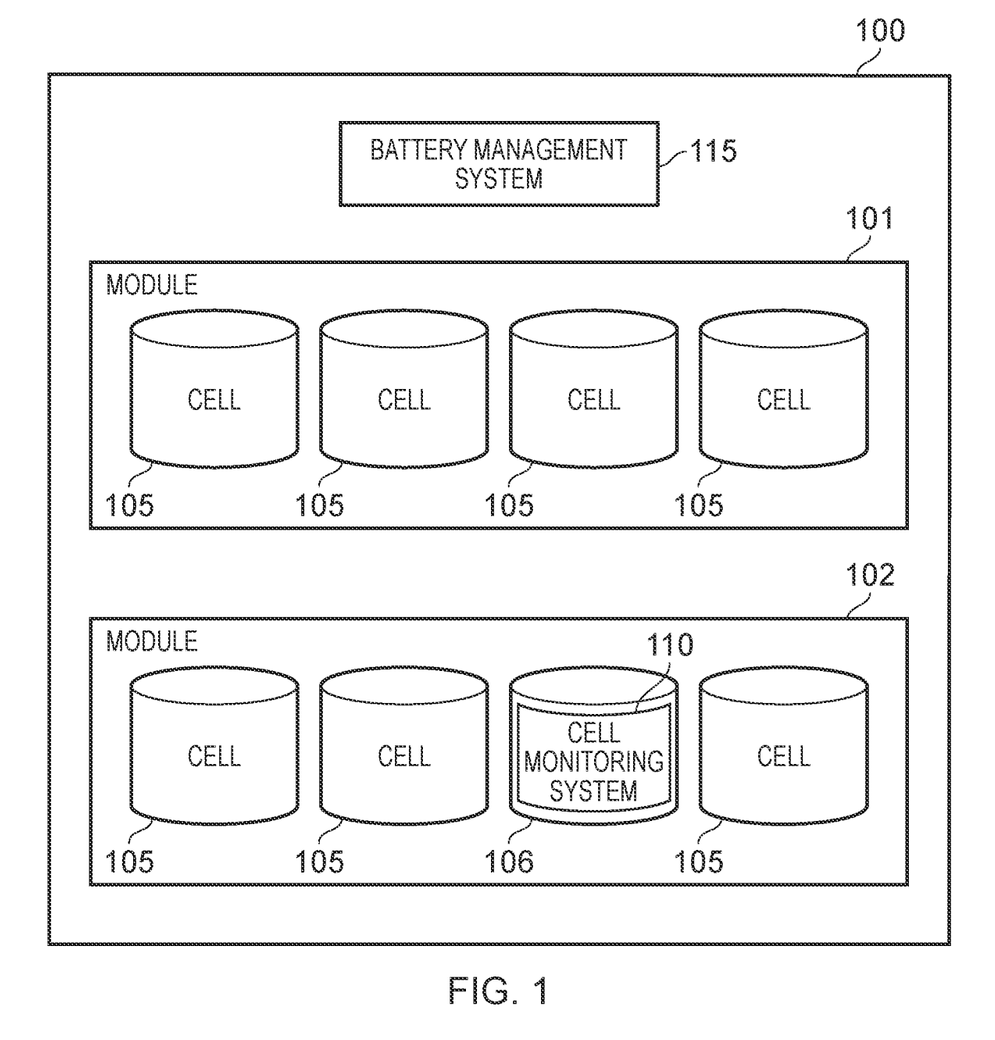
FIG. 1 schematically illustrates a battery pack according to some disclosed examples comprising a battery management system and multiple battery modules, wherein each battery module comprises multiple battery cells and at least one battery cell is provided with a battery cell monitoring system.

FIG. 1 illustrates a battery pack 100. The battery pack 100 comprises plural battery modules 101, 102, and each battery module comprises plural battery cells 105, 106. Purely for the purposes of clarity of illustration, the battery pack in FIG. 1 is only shown to comprise two battery modules, but the present techniques are in no way limited to this number of battery modules, and battery packs with an arbitrary number of further modules are also contemplated. Similarly, the clarity of illustration the battery modules 101, 102 in FIG. 1 are each shown to comprise four battery cells, but the present techniques are in no way limited to this number of battery cells in a battery module, and battery packs with an arbitrary number of battery cells are contemplated. To note in particular in the illustration of FIG. 1, is the battery cell 106, which is shown to comprise a battery cell monitoring system 110. The battery cell monitoring system 110 is formed on a flexible substrate (e.g. a plastic substrate) and the components of the battery cell monitoring system (which are not shown in FIG. 1) are integrated onto its flexible substrate. These components comprise a computing device and at least one sensor. The sensor generates sensor signals which provide the computing device with information relevant to the physical state of the battery cell. It should be noted that only battery cell 106 in FIG. 1 is explicitly shown to comprise a battery cell monitoring system 110, but this is merely for simplicity and clarity of illustration, and any number of the battery cells in a battery module may be provided with such a battery cell monitoring system, and this applies to each of the battery modules in the battery pack. The battery pack further comprises a battery management system 115, which is in overall control of the operation of the battery pack. As will be described in more detail with reference to the figures which follow, the battery cell monitoring system 110 may be in communication with the battery management system 115, in order to enhance the control of the operation of the battery pack.

Figure 2:
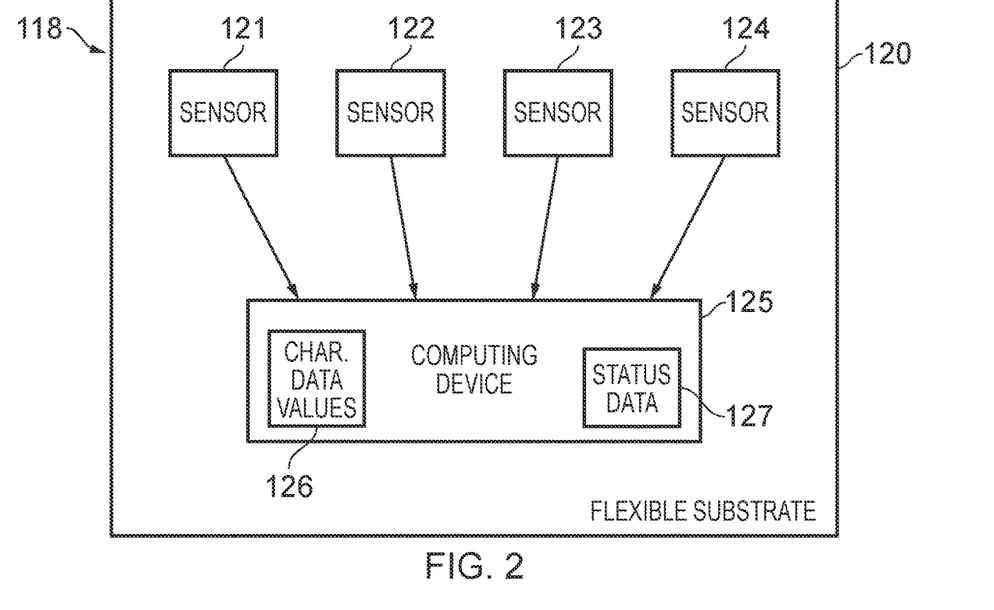
FIG. 2 schematically illustrates a battery cell monitoring system according to some disclosed examples.

FIG. 2 schematically illustrates a battery cell monitoring system 118. The system is based on a flexible substrate 118, which may for example be plastic. A number of different components of the system are integrated onto the flexible substrate. The components may for example be in the form of printed electronics. Although the substrate itself is flexible, whilst all of the components may also be flexible, in some examples at least some of the components are rigid or thinned components. The components of the system shown in FIG. 2 comprise sensors 121, 122, 123, and 124, as well as computing device 125. The sensors 121-124 may take a variety of forms and may differ from one another or at least some of the sensors may be of the same type. The computing device 125 is arranged to receive sensor signals generated by the sensors. The computing device 125 is further arranged to hold characteristic data values 126, where these characteristic data values have been generated in dependence on prior sensor signals. It is to be noted that although the sensors 121-124 and computing device 125 are electronic devices, the battery cell monitoring system 118 is not provided with an explicit power source, such as a printed battery, since it is assumed that the battery cell being monitored will be able to provide the very modest power supply required. However, in some examples, an explicit power source could be provided as one of the components integrated into the flexible substrate 120.

By processing the sensor signals currently being received from the sensors with reference to the characteristic data values 126 the computing device 125 determines status information for the battery cell with which the battery cell monitoring system 118 is associated. For example, it may be adhered to the surface of the battery cell. In other examples it may be more deeply physically integrated into the structure of the battery cell. The status information for the battery cell provides status data 127. The status data may be made use of in a variety of ways as will be described in more detail with reference to the figures which follow.

Figure 3:
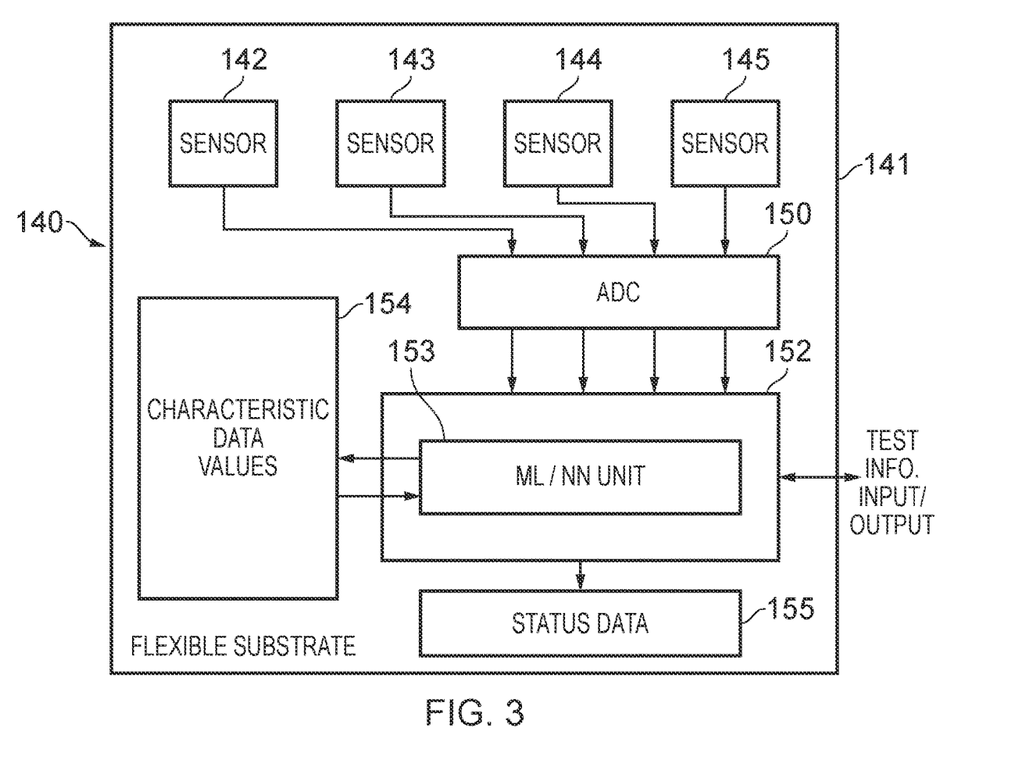
FIG. 3 schematically illustrates a battery cell monitoring system according to some disclosed examples.

FIG. 3 schematically illustrates a battery cell monitoring system 140. The system is based on a flexible substrate 141, which in this example is a suitable variety of plastic. Four sensors are integrated onto the flexible substrate 141, which in this example are a temperature sensor 142, a gas sensor 143, the deformation sensor 144, and a voltage sensor 145. However any of the sensors may be substituted for other types of sensor as may be useful for monitoring the battery cell (e.g. a humidity sensor or a current sensor), These four sensors are suitably positioned on the flexible substrate 141, in particular with respect to where the battery cell monitoring system 140 is intended to be placed with respect to the battery cell being monitored, such that they may provide useful sensor signals with respect to the temperature, gas emission, deformation, and voltage of the battery cell. A battery cell will typically have an acceptable operating temperature range and deviations outside this range may be indicative of potential problems. A battery cell may be known to emit a certain gas or gases when it is not operating correctly. The mechanical stability of a battery cell may vary when the battery cell is not operating correctly or mechanical change (deformation) of a battery cell may not itself necessarily be problematic, but may be correlated with subsequent problems, e.g. battery cell failure may follow a mechanical deformation such as due to an impact. The voltage and/or current of a battery cell will typically have normal operational ranges. As in the case of FIG. 2, the battery cell monitoring system 140 is not provided with an explicit power source, such as a printed battery, since it is assumed that the battery cell being monitored will be able to provide the very modest power supply required. However, in some examples, an explicit power source could be provided as one of the components integrated into the flexible substrate 141.

The sensor signals generated by the sensors are received by an analogue-to-digital (ADC) converter 150, the outputs of which are passed to computing unit 152. In this example the computing unit 152 comprises a machine learning (ML) or neural network (NN) unit 153, which is shown in FIG. 3 as being in communication with a set of stored characteristic data values 154. At least some of the characteristic data values 154 are generated and stored by the computing device 152 in a training phase, during which the sensors 142-145 are subjected to a range of temperatures, gas emissions, deformations, and voltages respectively, either by virtue of a battery cell to which the battery cell monitoring system 140 is attached being caused to operate under a range of conditions, such that these temperatures, gas emissions, deformations, and voltages result, or by the sensors 142-145 being subjected to the range of temperatures, gas emissions, deformations, and voltages by means of a test environment (possibly without a battery cell being present at all). The computing unit 153 has a test information input, such that an operator in control of the training phase can control aspects of the computing unit 153 and the characteristic data values 154 which are generated in correlation with the current conditions to which the battery cell monitoring system 140 is being subjected. For example, for a range of conditions applicable to one of the sensors, the test information input is used to indicate what sub-range of that range of conditions is to be classified as acceptable (i.e. healthy operation of the battery cell) and what sub-range of that range of conditions is to be classified as not acceptable (i.e. non-healthy operation of the battery cell). Gradations of classification may also be provided between an optimal, no aspect of operation is of concern status which may be reported, through various levels of decreasing quality of operation, whereby it is then an implementation of choice at which point on such a scale the status of the battery would be indicated to be in need of intervention.

Some of the characteristic data values 154 may be separately programmable, e.g. as weighting values to be applied to the respective inputs from the sensors, in order to vary their respective influence on the output of the ML/NN unit 153 and/or computing unit 152. Moreover, although the characteristic data values 154 are shown in FIG. 3 separately from the ML/NN unit 153 and the computing unit 152, in some implementations these characteristic data values may at least partially be an integral part of either the ML/NN unit 153 or the computing unit 152. For example, these characteristic data values may provide node weightings used in a network of nodes in the ML/NN unit 153. In some examples, once the training phase has been carried out (whether using a battery cell or an artificial test environment), the characteristic data values are exported such that they can then be stored in a multitude of such battery cell monitoring systems, such as on a production line. Thus configured for operation, once associated with a battery cell, the battery cell monitoring system 140 monitors the battery cell and generate status data 155 indicative of the current status of the battery cell. This status data 155 may be made use of in a variety of ways which will be explained in more detail with reference to the figures which follow.

Figure 4A:
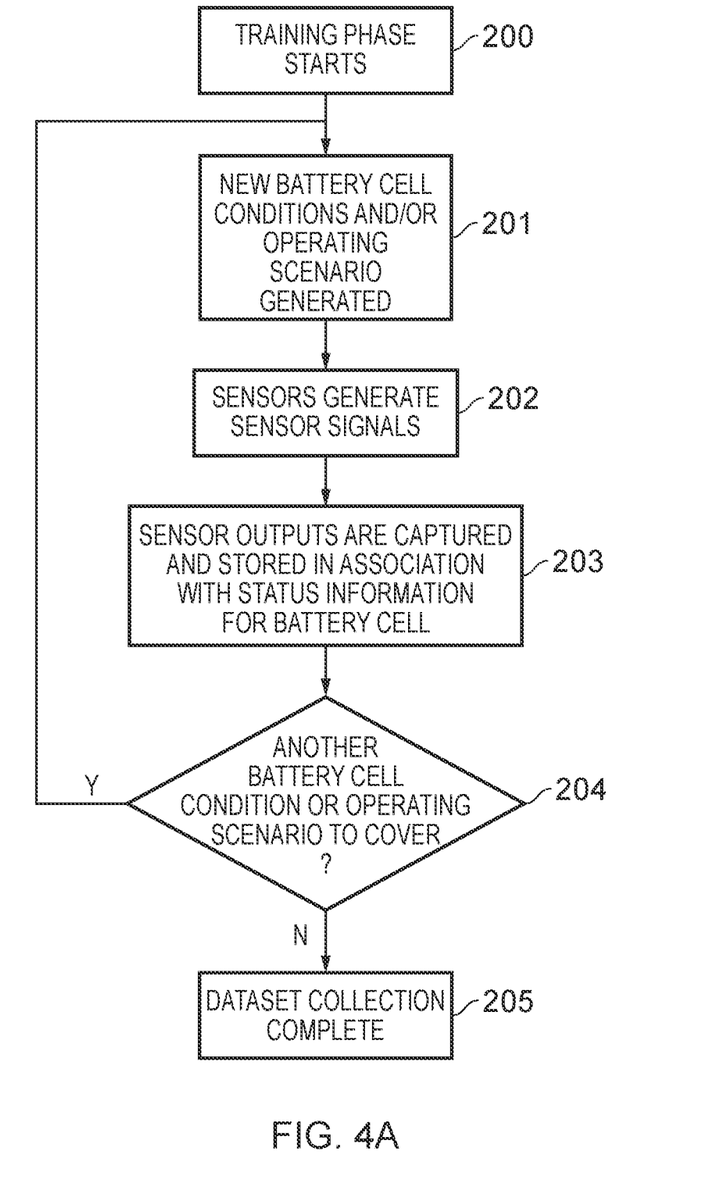
FIGS. 4A and 4B are flow diagrams showing sequences of steps which are taken according to the method of some disclosed examples, in which a training phase for a battery cell monitoring system is implemented.
Figure 4B:
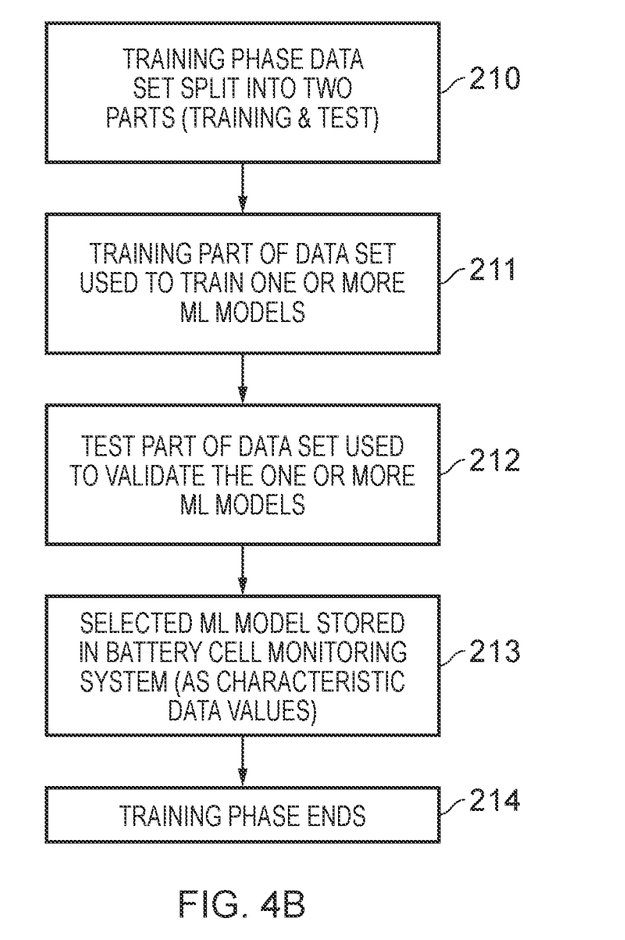

FIGS. 4A and 4B are flow diagrams showing sequences of steps which are taken according to the method of some disclosed examples, in which a training phase for a battery cell monitoring system is implemented. The training phase begins with FIG. 4A at step 200. In this example the battery cell monitoring system is attached to a battery cell which is operated under test conditions for the purposed of the training phase. Thus at step 201 the battery cell operates under a set of known conditions and/or in a known operating scenario. For example, the training phase may be used to cover a great range of operating conditions, which represent a useful testing range for the purposes of training the battery cell monitoring system (e.g. temperature range, shocks, mechanical stress, gas emissions of the cell, and so on). In one example the battery cell is intentionally subjected to a significant range of temperatures. In response signals from the sensors of the battery cell monitoring system are generated at step 202. At step 203, the sensor outputs are captured and stored in association with status information for the battery cell (e.g. where the conditions are defined as "healthy" or "not healthy"). This storage of the sensor outputs may be within the storage of the battery cell monitoring system (e.g. in the storage provided for the characteristic data values 154 in the system 140 of FIG. 3 or the sensor outputs may be exported to external storage, for example as shown via the test information output of the computing unit 152. This approach may be taken for any of the sensors, individually or in combination, such that the computing device learns what sensor signals correspond to what types of battery status (by correlation with the test information input provided by the operator carrying out the training phase). These data from the sensors are thus captured and stored in association with status information for the battery call. At step 204 it is determined if there is another condition, operating scenario, or state of the battery for which the battery cell monitoring system is still to be trained, and when there is the flow returns to step 201. When all training scenarios have been completed and the corresponding sensor data captured, the flow concludes at step 205.

Next, referring to FIG. 4B, the training phase data captured and stored by the process of FIG. 4A is first split into two parts at step 210. A first part of the dataset is reserved for training of one or more ML models, whilst a second part of the dataset is reserved for validating one or more trained ML models. Then at step 211 the training part of the dataset is used to train one or more ML models, whereby the sensor signals stored in association with battery cell status information is used to learn the association between the combinations of sensor signals observed and the corresponding battery cell status information defined for a given battery cell operating status or scenario. Once this training is complete then at step 212 the validation part of the dataset is used to validate the one or more ML models trained. On this basis a trained ML model can be selected for implementation in the battery cell monitoring system (for example on the basis that is outperformed other ML models in correctly predicting the battery cell status on the basis of the sensor signals). Then at step 213, a selected ML model is stored in the battery cell monitoring system (for example where learned weights are stored as the characteristic data values 154 in the example of FIG. 3). The training phase then ends at step 214, and the battery cell monitoring system is ready for operation.

Figure 5:
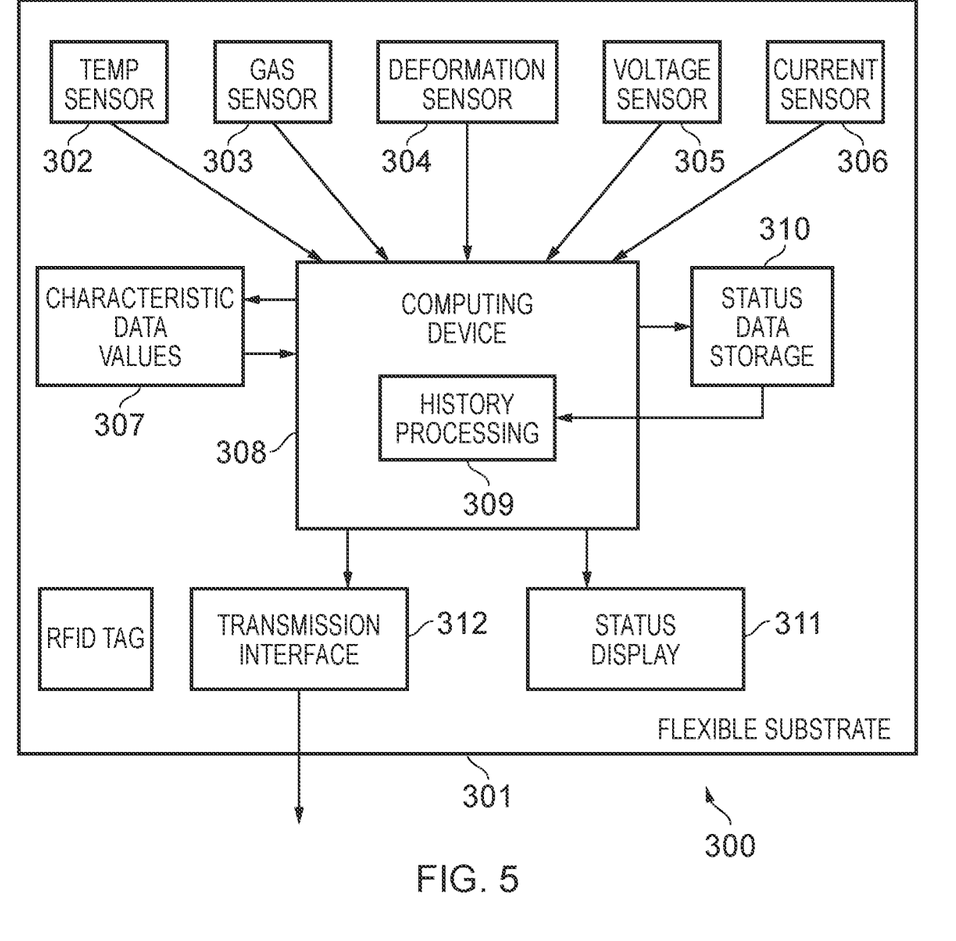
FIG. 5 schematically illustrates a battery cell monitoring system according to some disclosed examples.

FIG. 5 schematically illustrates a battery cell monitoring system 300. The system is based on a flexible substrate 301. Five sensors are printed onto the flexible substrate 301, which in this example are a temperature sensor 302, a gas sensor 303, the deformation sensor 304, a voltage sensor 305, and a current sensor 306. These sensors are suitably positioned on the flexible substrate 301, such that when the battery cell is being monitored they provide useful sensor signals with respect to the temperature, gas emission, deformation, voltage and current draw of the battery cell. As before an explicit power source is not shown, but a printed battery or indeed an energy harvester could be provided. Each of the sensors may be made use of either individually or in combination in order to determine a status for the battery cell. The particular sensor signals or combinations of sensor signals corresponding to a given predefined status are learned in a training phase, for example as described above with reference to FIG. 4. The training phase results in the characteristic data values 307 held by the battery cell monitoring system 300, where it is noted that these characteristic data values 307 may have been "learned" by this particular battery cell monitoring system 300 when it was subjected to a training phase, or may have been "learned" by another battery cell monitoring system (nevertheless of the same configuration) in a training phase, and the characteristic data values 307 were then copied into the storage 307 of this battery cell monitoring system 300 (and potentially many others in a manufacturing context). The computing device 308 of the battery cell monitoring system 300 thus has a configuration, based on the characteristic data values 307, which enables it to carry out the monitoring of a battery cell with which it is associated. For example, the flexible substrate 301 may be adhered to the surface of the battery cell.

The computing device 308 further comprises history processing unit 309 and the system 300 further comprises status data storage 310. In operation the computing device 308 generates status data and at least some of the status data is stored in status data storage 310. For example, status data snapshots generated at regular time intervals may be stored. The history processing unit 309 is configured to make use of the multiple items of status data stored in the status data storage 310, for example to determine a progression of one of the quantities monitored by the sensors or combined progressions of more than one of the quantities, where such progressions can be learned as part of the training phase and may be used as the basis for detection of evolution of the battery cell status towards an undesirable status, such that preventative or remedial action may be triggered in order to prevent that undesirable status from ever being reached. The system 300 further comprises a status display 311, which in this example is provided as an OLED printed onto the flexible substrate 301. The appearance of the status display 311 is controlled by the computing device 308 in dependence on the determined status of the battery cell. The system 300 further comprises a transmission interface 312, which connects the battery cell monitoring system 300 to an external device (not illustrated), such that the computing device 300 is able to report the battery cell status to that external device. The transmission interface 312 can be arranged to employ wireless technology, or may be the interface to a wired connection. The system of FIG. 5 is also shown to comprise an RFID tag, enabling the battery cell to be readily identified, such that the battery cell status information generated can easily be associated with the particular batter cell with which the system is associated. Where the battery cell monitoring system 300 is arranged to monitor a battery cell, in some examples the transmission interface 312 is arranged to report the battery cell status to a control unit forming part of the wider battery module and/or battery pack of which the battery cell forms part. Such an arrangement is described in more detail below with reference to FIG. 6.

Figure 6:
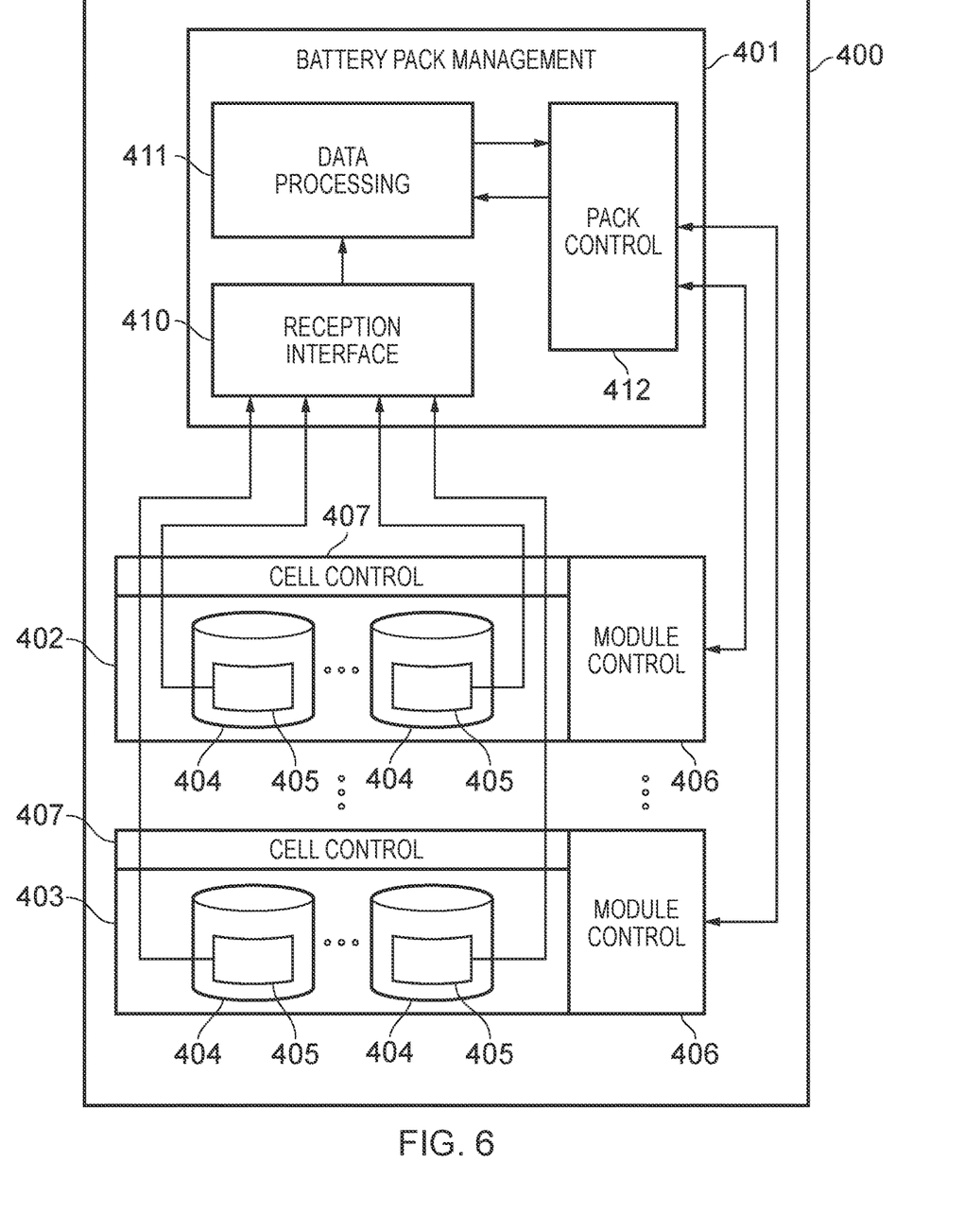
FIG. 6 schematically illustrates a battery pack according to some disclosed examples comprising a battery pack management system in communication with multiple battery modules, each having their own battery module control unit, and wherein each battery module comprises multiple battery cells of which at least a subset has a battery cell monitoring system.

FIG. 6 schematically illustrates a battery pack 400. The battery pack 400 comprises a battery pack management system 401 and multiple battery modules 402, 403. Only two battery modules are explicitly shown in FIG. 6, but as indicated by the ellipses between them, an arbitrary number of further battery modules may form part of the battery pack 400. Each battery module comprises multiple battery cells 404 (where again only two are explicitly shown in FIG. 6).

Each battery cell 404 comprises a battery cell monitoring system 405. Each battery module 402, 403 comprises its own module control 406 as well as cell control circuitry 407. Each battery cell monitoring system 405 is configured in a similar manner to the battery cell monitoring system 300 shown in FIG. 5, in that each comprises a transmission interface. These transmission interfaces enable the battery cell monitoring systems to communicate with the battery pack management system 401. For this purpose, the battery pack management system 401 is provided with a reception interface 410 configured to receive data transmissions from each of the battery cell monitoring systems. As was described above with reference to FIG. 5, these transmissions may be wired or wireless according to the preferred implementation. Battery cell status reports transmitted to the battery pack management system 401 are processed by the data processing circuitry 411. This thus enables the backpack management system to maintain an overview of the current status of each of the battery cells forming part of each of the battery modules within the battery pack. Furthermore, the battery pack management system 401 further comprises pack control circuitry 412, which is controlled by the data processing circuitry 411. In dependence on the battery cell status reports received, the battery pack management system 401 is able to control the operation of each battery module and each battery cell. For this purpose, the pack control circuitry 412 is communicatively coupled to the module control circuitry 406 of each of the battery modules. The module control circuitry 406 further has control over the cell control circuitry 407. In this manner the battery pack management system 401 can monitor and control the operation of all battery cells of all battery modules within the battery pack. Further, preventative or remedial action can be taken if a battery cell status report indicates that at least one battery cell performing sub-optimally. Individual battery cells, or indeed whole battery modules, can be switched off by the battery pack management system if required. Finer grained control over the individual battery cells or battery modules can also be exerted, for example to modify a charging rate (or a usage discharge rate) of a given battery cell, set of battery cells, battery module, or set of battery modules as is appropriate to the status information received.

Figure 7:
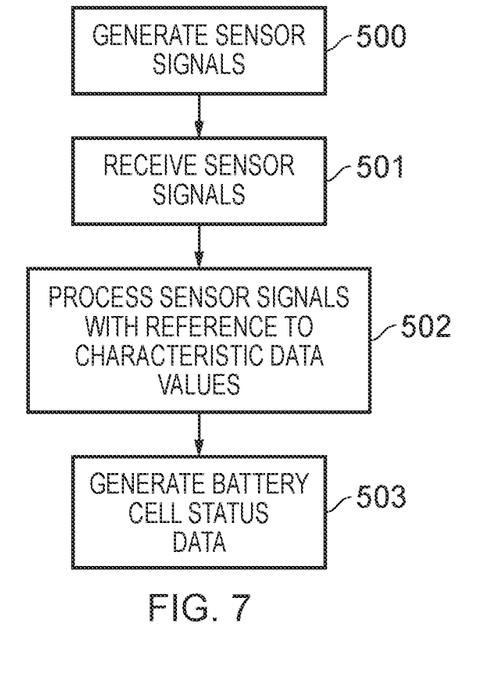
FIG. 7 is a flow diagram showing a sequence of steps which are taken according to the method of some disclosed examples when operating a battery cell monitoring system.

FIG. 7 is a flow diagram showing a sequence of steps which are taken according to the method of operating a battery cell monitoring system in some examples. The flow begins at step 500, where the sensors of the battery cell monitoring system generate sensor signals in response to their current environment, whereby the close association of the battery cell monitoring system (for example by means of its flexible substrate being adhered to or wrapped around the battery cell) means that these sensor signals are indicative of the current status of the battery cell. The sensor signals are received by a computing device of the battery cell monitoring system at step 501. Then at step 502 the sensor signals are processed with reference to stored characteristic data values. This may comprise signal conditioning (e.g. filtering, amplification), analogue to digital conversion of the sensor signals and may comprise application of the set of sensor signals to a machine learning or neural network component of the computing device, whereby the stored characteristic data values have previously been learnt in association with defined battery statuses. On this basis the computing device of the battery cell monitoring system then infers a current battery status and this battery cell status is generated at step 503.

In brief overall summary, battery cell monitoring systems comprising a flexible substrate and components integrated onto the flexible substrate, and methods of operating the same are disclosed. The components comprise a computing device and at least one sensor, where the at least one sensor is configured to generate sensor signals indicative of a physical state of the battery cell. The computing device is configured to hold characteristic data values which have been generated based on prior sensor signals. The computing device is configured to receive the sensor signals from the at least one sensor and to generate battery cell status data in dependence on the sensor signals and the characteristic data values.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

We claim:

1. A battery cell monitoring system comprising:
a flexible substrate; and
components integrated onto the flexible substrate, wherein the components comprise:
a computing device; and
at least one sensor, wherein:
the at least one sensor is configured to generate sensor signals indicative of a physical state of the battery cell,
the computing device is configured to hold characteristic data values and the characteristic data values have been generated based on prior sensor signals,
the computing device is configured to receive the sensor signals from the at least one sensor and to generate battery cell status data in dependence on the sensor signals and the characteristic data values;
the characteristic data values have at least partially been generated by another battery cell monitoring system operating in a training phase, wherein the other battery cell monitoring system comprises machine learning capability configured to learn correspondences between patterns of sensor signals and classifications of battery cell physical states,
in the training phase the machine learning capability of the other battery cell monitoring system learned the correspondences and the characteristic data values generated by the other battery cell monitoring system have been transferred to the battery cell monitoring system, and
the battery cell status data is generated in dependence on an inferred classification in dependence on the sensor signals.

2. The battery cell monitoring system as claimed in claim 1, wherein the computing device comprises machine learning capability configured to infer correspondences between patterns of sensor signals and classifications of battery cell physical states, wherein the characteristic data values have at least partially been generated based on the prior sensor signals in a training phase in which the machine learning capability learned the correspondences,
and wherein the battery cell status data is generated in dependence on an inferred classification in dependence on the sensor signals.

3. The battery cell monitoring system as claimed in claim 1, wherein the battery cell physical states in the training phase comprise healthy battery cell statuses and/or non-healthy battery cell statuses.

4. The battery cell monitoring system as claimed in claim 1, wherein the battery cell physical states in the training phase comprise a range of battery cell physical states in a progression from a healthy battery cell status to a non-healthy battery cell status.

5. The battery cell monitoring system as claimed in claim 1, wherein the at least one sensor comprises one or more of:
a temperature sensor;
a gas emission sensor;
a physical deformation sensor;
a humidity sensor;
a voltage sensor; and
a current sensor.

6. The battery cell monitoring system as claimed in claim 1, wherein the components further comprise battery cell operation control circuitry,
wherein the battery cell operation control circuitry is configured to control an operation of the battery cell in dependence on the battery cell status data.

7. The battery cell monitoring system as claimed in claim 6, wherein the operation of the battery cell comprises at least one of:
charging of the battery cell; and
usage discharging of the battery cell.

8. The battery cell monitoring system as claimed in claim 1, wherein the components further comprise a status data storage configured to store iterations of battery cell status data generated by the computing device.

9. The battery cell monitoring system as claimed in claim 8, wherein the computing device further comprises battery cell history processing circuitry, wherein the battery cell history processing circuitry is configured to determine a battery cell status in dependence on the iterations of battery cell status data stored in the status data storage.

10. The battery cell monitoring system as claimed in claim 1, wherein the components further comprise a status display, wherein status display is configured to modify its visual appearance in dependence on the battery cell status data generated by the computing device.

11. The battery cell monitoring system as claimed in claim 1, wherein the components further comprise transmission circuitry configured to send a transmission in dependence on the battery cell status data.

12. A battery pack comprising:
a plurality of battery modules, wherein each battery module comprises a plurality of battery cells and wherein at least one of the plurality of battery cells comprises the battery cell monitoring system as claimed in claim 11; and
a battery pack management system comprising reception circuitry configured to receive the transmission from the transmission circuitry of the battery cell monitoring system.

13. The battery pack as claimed in claim 12, wherein the battery pack management system comprises data processing circuitry,
   wherein the data processing circuitry is configured to control an operation of the battery pack in dependence on the transmission.

14. The battery pack as claimed in claim 13, wherein the operation of the battery pack comprises at least one of:
   charging of the battery pack; and
   usage discharging of the battery pack.

15. The battery pack as claimed in claim 13, wherein the control of the operation of the battery pack comprises disabling at least one of:
   at least one of the plurality of battery modules; and
   at least one of the plurality of battery cells of at least one of the battery modules.

16. The battery pack as claimed in claim 14, wherein the control of the operation of the battery pack comprises modifying a charging rate or extent of at least one of:
   the plurality of battery modules; and
   the plurality of battery cells of at least one of the battery modules.

17. The battery pack as claimed in claim 13, wherein the battery pack management system comprises data storage circuitry,
   and wherein the data processing circuitry is configured to store at least one of:
      battery cell status data; and
      battery module status data,
   in dependence on transmissions received from battery cell monitoring systems.

18. A method of operating a battery cell monitoring system comprising a flexible substrate, wherein the method comprises:
   generating sensor signals in at least one sensor integrated on the flexible substrate indicative of a physical state of the battery cell;
   holding characteristic data values in a computing device integrated on the flexible substrate, wherein the characteristic data values have been generated based on prior sensor signals;
   receiving the sensor signals at the computing device integrated on the flexible substrate from the at least one sensor integrated on the substrate;
   generating battery cell status data in dependence on the sensor signals and the characteristic data values;
   generating the characteristic data values, at least partially by another battery cell monitoring system operating in a training phase, wherein the other battery cell monitoring system comprises machine learning capability configured to learn correspondences between patterns of sensor signals and classifications of battery cell physical states;
   learning, by the machine learning capability of the other battery cell monitoring system operating in the training phase, the correspondences, and transferring the characteristic data values generated by the other battery cell monitoring system to the battery cell monitoring system; and
   generating the battery cell status data in dependence on an inferred classification in dependence on the sensor signals.

* * * * *